(12) United States Patent
Otto et al.

(10) Patent No.: US 10,516,079 B2
(45) Date of Patent: Dec. 24, 2019

(54) METHOD FOR PRODUCING AN OPTOELECTRONIC SEMICONDUCTOR COMPONENT, AND OPTOELECTRONIC SEMICONDUCTOR COMPONENT

(71) Applicant: OSRAM Opto Semiconductors GmbH, Regensburg (DE)

(72) Inventors: Isabel Otto, Regensburg (DE); Alexander F. Pfeuffer, Regensburg (DE); Dominik Scholz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/006,765

(22) Filed: Jun. 12, 2018

(65) Prior Publication Data
US 2018/0294378 A1 Oct. 11, 2018

Related U.S. Application Data

(63) Continuation of application No. 15/508,899, filed as application No. PCT/EP2015/070077 on Sep. 2, 2015, now Pat. No. 10,026,868.

(51) Int. Cl.
*H01L 33/00* (2010.01)
*H01L 33/08* (2010.01)
(Continued)

(52) U.S. Cl.
CPC ............ *H01L 33/08* (2013.01); *H01L 27/156* (2013.01); *H01L 33/38* (2013.01); *H01L 21/28* (2013.01);
(Continued)

(58) Field of Classification Search
CPC ....... H01L 33/08; H01L 33/38; H01L 27/156; H01L 33/00; H01L 31/12; H01L 21/28;
(Continued)

(56) References Cited

U.S. PATENT DOCUMENTS 7,148,519 B2   12/2006   Wu et al.
7,501,657 B2   3/2009    Nagai
(Continued)

FOREIGN PATENT DOCUMENTS

DE   102012106364 A1   1/2014
DE   102012112530 A1   6/2014
(Continued)

*Primary Examiner* — Vu A Vu
(74) *Attorney, Agent, or Firm* — McDermott Will & Emery LLP

(57) ABSTRACT

A method is specified for producing an optoelectronic semiconductor component, comprising the following steps: A) providing a structured semiconductor layer sequence (21, 22, 23) having
a first semiconductor layer (21) with a base region (21c), at least one well (211), and a first cover region (21a) in the region of the well (211) facing away from the base surface (21c),
an active layer (23), and
a second semiconductor layer (22) on a side of the active layer (23) facing away from the first semiconductor layer (21), wherein
the active layer (23) and the second semiconductor layer (22) are structured jointly in a plurality of regions (221, 231) and each region (221, 231) forms, together with the first semiconductor layer (21), an emission region (3), B) simultaneous application of a first contact layer (41) on the first cover surface (21a) and a second contact layer (42) on a second cover surface (3a) of the emission regions (3) facing away from the first semiconductor layer (21) in such a way that
(Continued)

the first contact layer (41) and the second contact layer (42) are electrically separated from each other, and the first contact layer (41) and the second contact layer (42) run parallel to each other.

20 Claims, 6 Drawing Sheets

(51) Int. Cl.
*H01L 27/15* (2006.01)
*H01L 33/38* (2010.01)
*H01L 21/28* (2006.01)
*H01L 21/3065* (2006.01)
*H01L 21/311* (2006.01)
*H01L 21/3213* (2006.01)
*H01L 21/461* (2006.01)
*H01L 25/16* (2006.01)
*H01L 31/12* (2006.01)

(52) U.S. Cl.
CPC ......... *H01L 21/3065* (2013.01); *H01L 21/311* (2013.01); *H01L 21/3213* (2013.01); *H01L 21/461* (2013.01); *H01L 25/167* (2013.01); *H01L 31/12* (2013.01); *H01L 33/00* (2013.01); *H01L 2933/0016* (2013.01); *H01L 2933/0033* (2013.01)

(58) Field of Classification Search
CPC ............... H01L 21/3065; H01L 21/311; H01L 21/3213; H01L 25/167; H01L 21/461; H01L 2933/0033; H01L 2933/0016
USPC .......................................................... 257/99
See application file for complete search history.

(56) References Cited

U.S. PATENT DOCUMENTS

| 7,709,849 | B1* | 5/2010 | Kal ....................... H01L 27/153 257/96 |
| 2011/0089401 | A1 | 4/2011 | Hiraiwa et al. |
| 2011/0198641 | A1 | 8/2011 | Yahata et al. |
| 2012/0305889 | A1 | 12/2012 | Lim et al. |
| 2013/0187192 | A1* | 7/2013 | Hoeppel ............ H01L 31/02005 257/99 |
| 2013/0221372 | A1 | 8/2013 | Lee et al. |
| 2015/0255692 | A1 | 9/2015 | Pfeuffer |

FOREIGN PATENT DOCUMENTS

| EP | 2325905 A2 | 5/2011 |
| WO | WO-2013092304 A1 | 6/2013 |
| WO | WO-2014033041 A1 | 3/2014 |
| WO | WO-2015121062 A1 | 8/2015 |

* cited by examiner

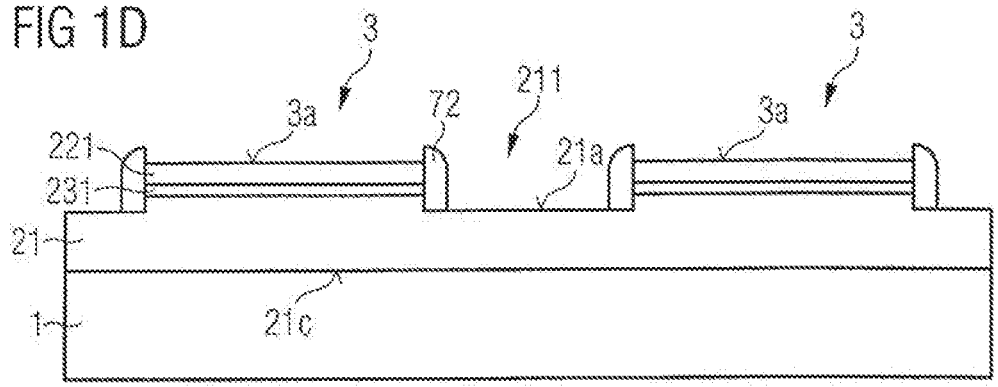
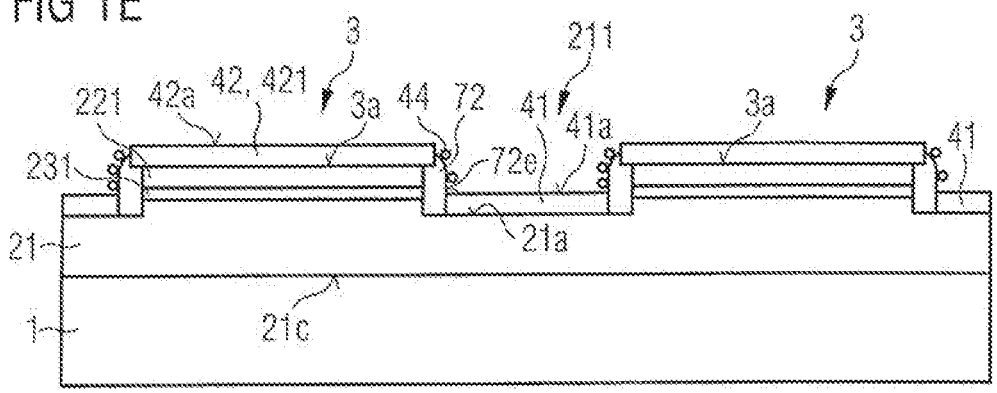
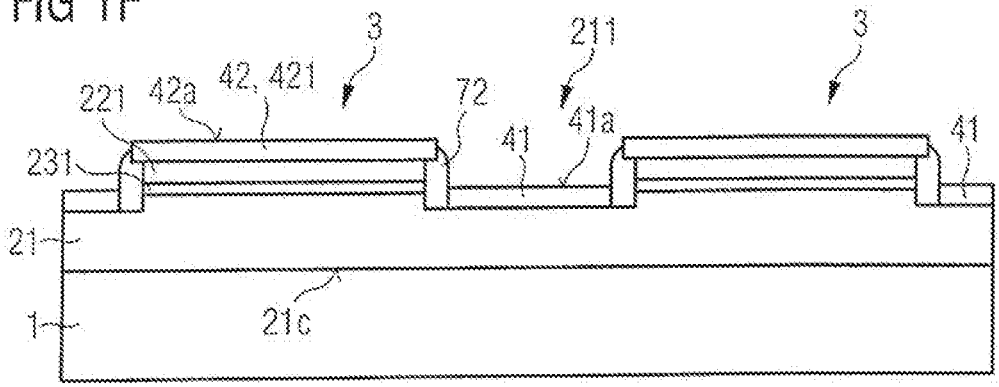

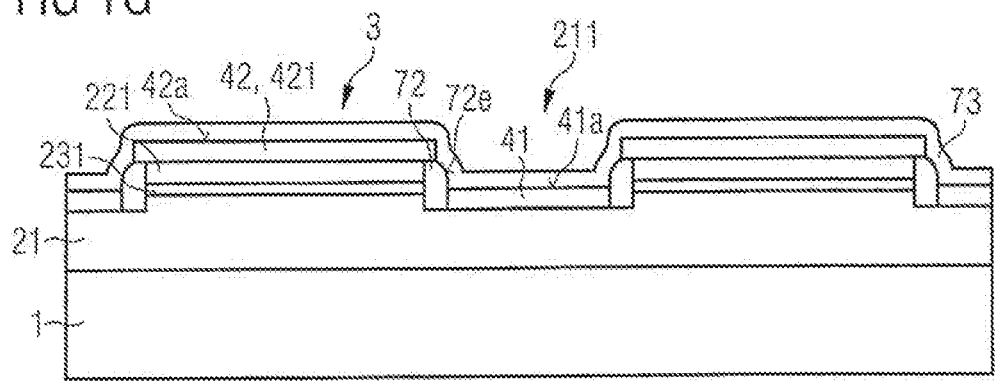
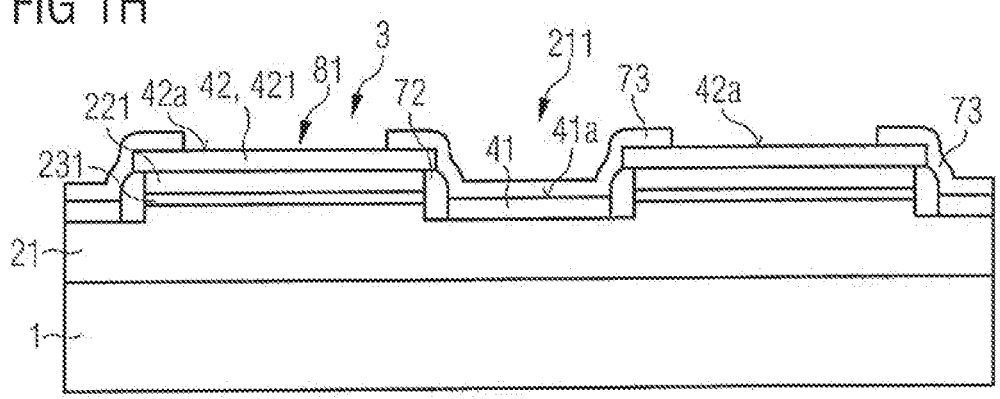
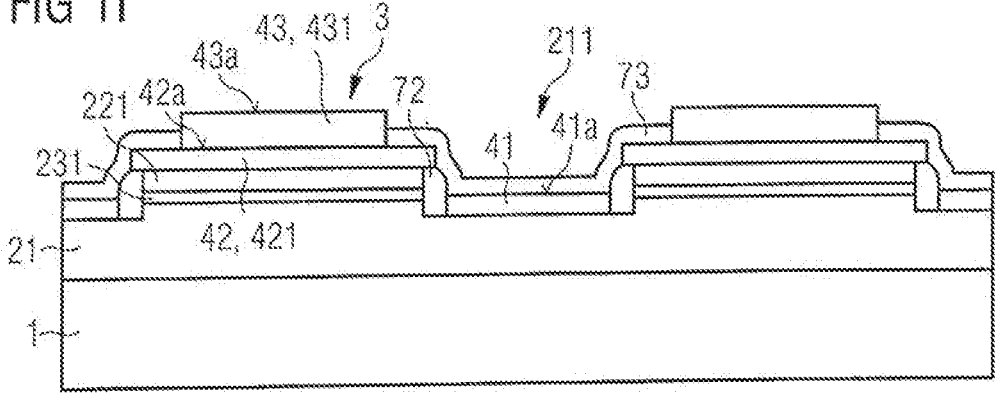

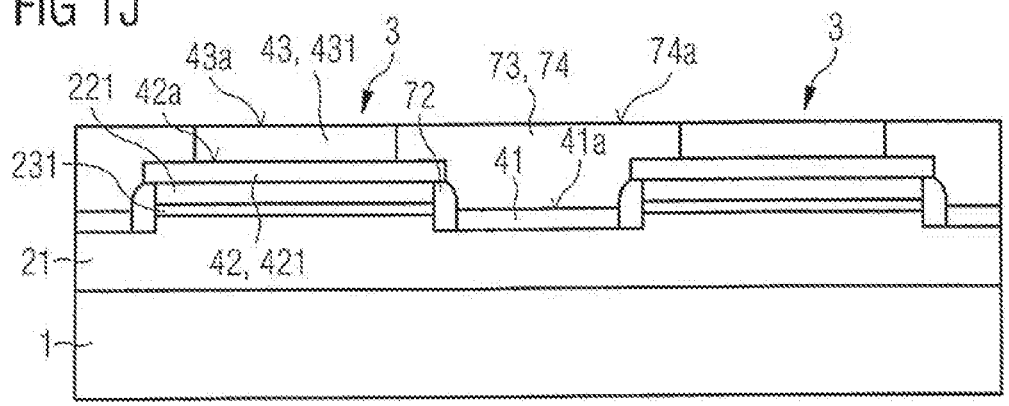
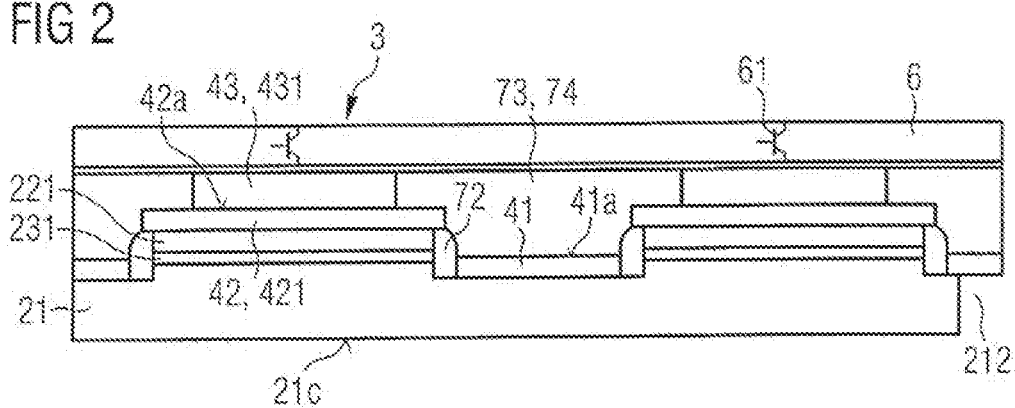
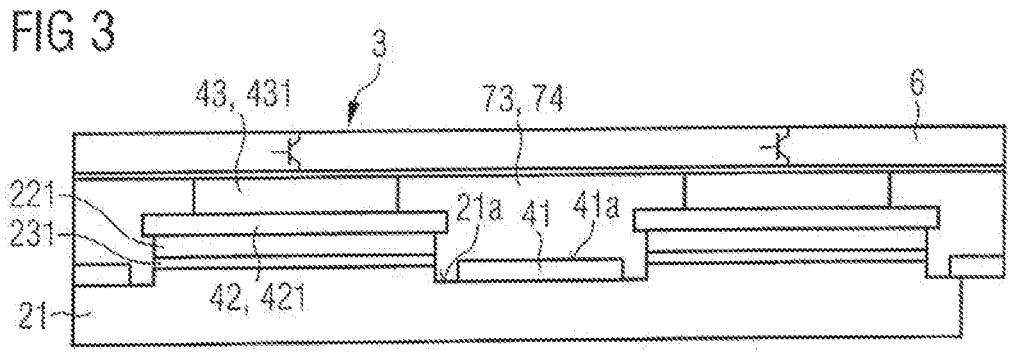

METHOD FOR PRODUCING AN OPTOELECTRONIC SEMICONDUCTOR COMPONENT, AND OPTOELECTRONIC SEMICONDUCTOR COMPONENT

This application is a continuation of U.S. application Ser. No. 15/508,899, filed Mar. 3, 2017, which is a national stage application of International Patent Application No. PCT/EP2015/070077, filed Sep. 2, 2015, which claims the benefit of priority to German Patent Application No. 102014112750.1, filed on Sep. 4, 2014, all of which are hereby incorporated by reference in their entirety for all purposes.

SUMMARY

A method for producing an optoelectronic semiconductor component and an optoelectronic semiconductor component are provided.

Document WO 2013/092304 A1 describes a display device and a method for producing a display device.

One object to be achieved consists in providing a simplified method for producing an optoelectronic semiconductor component. A further object to be achieved consists in providing an optoelectronic semiconductor component which may be produced in a simplified manner.

A method is provided for producing an optoelectronic semiconductor component. The optoelectronic semiconductor component may for example be a radiation-emitting semiconductor component, such as for example a light-emitting diode. For example, the optoelectronic semiconductor component may be provided at least as a part or component of a display device and/or at least as a part or component of a light source. Furthermore, the optoelectronic semiconductor component may be a radiation-detecting semiconductor component, such as for example a photodiode. In particular, it is possible with the optoelectronic semiconductor component to emit and/or detect electromagnetic radiation in a spatially resolved manner.

According to at least one embodiment of the method, a semiconductor layer sequence is provided. The semiconductor layer sequence comprises a first semiconductor layer, an active layer and a second semiconductor layer. The semiconductor layer sequence is patterned. Patternings of the semiconductor layer sequence may here and hereinafter comprise raised portions, recesses, openings and/or cutouts. In particular, patterning may extend in at least one dimension by at least 0.5 µm. Patterning may extend at least in part through the first semiconductor layer, the active layer and/or the second semiconductor layer. For example, regions of the semiconductor layer sequence are removed and form at least one recess, opening and/or cutout, which adjoins a raised portion in the semiconductor layer sequence.

The first semiconductor layer, the second semiconductor layer and the active layer are formed from a semiconductor material. The semiconductor material may for example be based on a nitride compound semiconductor material. The first semiconductor layer may be n-conductive, while the second semiconductor layer may be p-conductive. The first semiconductor layer, the active layer and the second semiconductor layer may for example be produced by epitaxial growth on a growth substrate.

The first semiconductor layer is of one-piece configuration and comprises a bottom face. Here and hereinafter, a layer is of one-piece configuration if it is formed from one piece and/or is of connected configuration. Preferably, at least one face of the first semiconductor layer is configured in plan view to be multiply connected, preferably simply connected. A "plan view" is here and hereinafter a plan view onto the optoelectronic semiconductor component from the bottom face of the first semiconductor layer or from a side remote from the bottom face.

The bottom face is preferably of simply connected configuration. Furthermore, the first semiconductor layer comprises a main plane of extension in which it extends in lateral directions. Perpendicular to the main plane of extension, in the vertical direction, the first semiconductor layer comprises a thickness. The thickness of the semiconductor layer is small relative to the maximum extent of the first semiconductor layer in a lateral direction.

The first semiconductor layer further comprises at least one recess. In particular, the semiconductor layer comprises a multiplicity of recesses. Where a "multiplicity" of recesses is mentioned below, the associated disclosure may also relate to embodiments with just a single recess. For example, the at least one recess comprises a trench and/or an opening in the first semiconductor layer. The at least one recess may here form the patterning of the semiconductor layer sequence. The first semiconductor layer has a smaller thickness in the region of the recesses than in the regions outside the recesses. Here and hereinafter, the "thickness" of a layer denotes its extent in the vertical direction. Each recess has a depth, wherein the depth corresponds to the reduction in thickness of the first semiconductor layer in the region of the recesses. Furthermore, each recess has a width which is determined by the shortest distance between two regions of the first semiconductor layer of greater thickness. The recesses do not pass right through the semiconductor layer, whereby the latter may be configured in one piece.

The first semiconductor layer further comprises a first top face remote from the bottom face in the region of the recesses. The first top face for example comprises higher doping and/or higher conductivity than regions of the first semiconductor layer which are at a smaller distance in the vertical direction from the bottom face than is the first top face.

The active layer is arranged at a side of the first semiconductor layer remote from the bottom face. The second semiconductor layer is arranged at a side of the active layer remote from the first semiconductor layer.

The active layer and the second semiconductor layer are jointly patterned. Patterning may for example use an etching process with an etching mask produced using a photo technique.

Together with the first semiconductor layer, the active layer and the second semiconductor layer form at least one emission region. In this respect, it is possible for the semiconductor layer sequence to have an emission region configured in one piece. In this case, the semiconductor layer sequence has a single emission face, remote from the first semiconductor layer, which is of multiply connected configuration. It is however also possible for the semiconductor layer sequence to comprise a plurality of emission regions which are separated laterally from one another by the recesses. The width of the recesses then corresponds for example to the smallest lateral distance between two emission regions.

According to at least one embodiment of the method, a first contact layer and a second contact layer are applied. Application of the two contact layers proceeds simultaneously. Application is preferably performed using the same method. In particular, the same method may mean the same method step. The first contact layer is applied to the first top face and comprises a first contact face remote from the first top face. The second contact layer is applied to a second top face, remote from the first semiconductor layer, of the at least one emission region and comprises a second contact face remote from the second top face.

In the case of an emission region configured in one piece, the second top face may be the connected emission face of the emission region. The second contact layer may then be configured in one piece and the second contact face may be of multiply connected configuration. In the case of a plurality of spatially spaced emission regions, the second top face may comprise a multiplicity of non-connected surfaces. The second contact layer may then be of multi-piece configuration, wherein one emission region is associated on a one-to-one basis with each region of one-piece configuration of the second contact layer.

Simultaneous application of the first contact layer and the second contact layer proceeds in such a way that the first contact layer and the second contact layer are electrically separated from one another. For example, the electrical separation may proceed by spatial spacing of the first contact layer and the second contact layer. For example, the second contact layer and the first contact layer are arranged at a vertical distance from one another, wherein this vertical spacing may be determined by the finite depth of the recesses. The first and second contact layers then extend in two different planes spaced vertically from one another, which in each case extend along the main plane of extension. The vertical distance between the first contact face and one of the second contact faces amounts for example to at most 2 µm, preferably at most 1 µm. The thickness of the first contact layer and of the second contact layer is preferably less than the depth of the recess. The vertical distance between the first contact face and the active layer preferably amounts to at least 0.5 µm, particularly preferably at least 0.2 µm.

The first contact layer and the second contact layer extend within the bounds of manufacturing tolerances parallel to one another and to the main plane of extension. Preferably, all the side faces, extending transversely of the main plane of extension, of the at least one emission region are substantially free of the first and second contact layers. A face extending "transversely" of the main plane of extension is here and hereinafter in particular a face which does not extend parallel thereto. A face extending "transversely" preferably forms an angle of at least 70° with the main plane of extension.

Simultaneous application of the first contact layer and of the second contact layer may proceed with a directional deposition method. The directional deposition method is for example physical vapor deposition (PVD).

The first and second contact layers are formed for example with an electrically conductive material, such as a metal or a transparent conductive oxide. The first and second contact layers may for example contain silver, aluminum, rhodium, platinum, gold, zinc oxide, indium-tin oxide and/or titanium or consist of these materials.

It is furthermore possible for the first and second contact layers to be unpatterned. "Unpatterned" may mean in this connection that a desired patterning, for example in respect of the emission regions, proceeds merely by self-patterning, in particular using a directional deposition method. In particular, it is possible for self-patterning not to require any mask, such as for example an etching mask, a photo mask and/or a growth mask.

According to at least one embodiment of the method for producing an optoelectronic semiconductor component, said method comprises the following steps:

A) provision of a patterned semiconductor layer sequence, comprising
    a first semiconductor layer configured in one piece, having a bottom face, a main plane of extension, at least one recess, in particular a multiplicity of recesses, and a first top face remote from the bottom face in the region of the recesses,
    an active layer and
    a second semiconductor layer on a side of the active layer remote from the first semiconductor layer, wherein
    the active layer and the second semiconductor layer are jointly patterned and, together with the first semiconductor layer, form at least one emission region, B) simultaneous application of a first contact layer to the first top face and of a second contact layer to a second top face, remote from the first semiconductor layer, of the at least one emission region such that
    the first contact layer and the second contact layer are electrically separated from one another,
    the first contact layer and the second contact layer extend within the bounds of manufacturing tolerances parallel to one another and to the main plane of extension and
    all of the side faces, extending transversely of the main plane of extension, of the at least one emission region and/or of the active layer are free of the first contact layer and of the second contact layer.

The method steps are preferably carried out in the stated sequence.

According to at least one embodiment of the method, the active layer and the second semiconductor layer are jointly patterned into a multiplicity of regions spaced laterally from one another. Each region of the active layer and of the second semiconductor layer forms, together with the first semiconductor layer, an emission region. The regions of the active layer or of the second semiconductor layer may in particular be one-piece regions. A one-piece region of the active layer and a one-piece region of the second semiconductor layer is then associated on a one-to-one basis with each emission region. In other words, the active layer and the second semiconductor layer may in each case be of multi-piece configuration and comprise one-piece regions which in plan view are preferably of simply connected configuration.

In the present method, the idea is pursued in particular of providing, by simultaneous application of the first contact layer and of the second contact layer with a directional deposition method, an optoelectronic semiconductor component having a high number of emission regions. In particular, the lateral extents of the emission regions and/or the width of the recesses separating the emission regions may be configured by this method to be as small as possible. Through the use of a directional deposition method, in conjunction with exploitation of the spatial separation, and thus electrical separation, of the first and second contact layers by the recesses, no separate photo technique may be necessary for application of the first and second contact layers. In this way, the adjustment effort required for a photo technique and additionally the provision of masks for the photo technique are dispensed with. Furthermore, the formation of recesses with a small width and/or laterally small emission regions is possible, since the respective extents are not limited by photo technique adjustment tolerances. For example, in this way recesses with a width of at most 2 µm and/or emission regions with a lateral extent of at most 10 µm, preferably at most 5 µm and particularly preferably at most 2 µm, may be provided. It is moreover possible, with such a method, to provide an optoelectronic semiconductor component with a one-piece emission region with recesses, the width of which amounts to at most 2 µm.

According to at least one embodiment of the method, prior to step B) of the method a passivation layer is applied to all the side faces of the emission regions. The passivation layer completely covers the side faces of the emission regions. Here and hereinafter, the term "emission regions" is understood also to mean an individual, one-piece emission region. For example, the passivation layer is formed with an electrically insulating material, such as $SiO_2$, SiN, $Al_2O_3$, or another metal oxide and/or metal nitride. A passivation layer is described in document WO 2014/033041 A1, the disclosure content of which is hereby explicitly included by reference.

The passivation layer may be applied for example as follows. First of all, the passivation layer is applied to all the exposed outer faces remote from the bottom face. The passivation layer is then partially removed using a directional etching method, for example a dry etching method with a plasma, which may contain chlorine, fluorine and/or argon. In the process, regions are exposed in which the first and the second contact layer are later applied. In other words, the first top face and the second top face are exposed at least in places. The partial removal proceeds in such a way that only regions of the passivation layer extending transversely of the main direction of extension remain on the exposed outer faces. For example, after the partial removal mainly the side faces of the emission regions are covered by the passivation layer.

According to at least one embodiment of the method, the passivation layer is removed after step B). For example, the passivation layer may be removed by means of etching. The etching may proceed for example using a buffered HF solution (buffered oxide etching, BOE), $H_3PO_4$ or HF. In this case, the idea is in particular pursued of removing material of the first and second contact layers, deposited during application of the first and second contact layers onto the passivation layer, together with the passivation layer, so eliminating any short circuit between the first and second contact layers. The traces of the material may for example have been deposited on the side faces by directional deposition which is not ideally vertical.

In particular, the traces of the material are material islands, the three-dimensional extent of which is so small that the material islands are at least in part not connected together. In particular, no electrically conductive path forms between the first contact layer and the second contact layer. The traces may be drops, grains and/or particles of the material which for example have an average extent in each spatial dimension of at most ⅕, preferably at most ⅒, of the thickness of the second contact layer and/or of the first contact layer.

According to at least one embodiment of the method, after method step B) the as yet unfinished optoelectronic semiconductor component is immersed into an etching bath for a predeterminable interval of time. In this way, traces of the material of the first contact layer and of the second contact layer are removed from the side faces of the emission regions or marginal faces, remote from the emission regions, of the passivation layer. Owing to the removal of these traces, a short circuit between the first contact layer and the second contact layer may be prevented and/or removed. Immersion into the etching bath takes place for example for an interval of time of at most ⅕, preferably at most ⅒ and particularly preferably at most 1/20, of a total etching time. The total etching time is the time which would be necessary for complete removal of the first or second contact layers. In particular, the total etching time is the time which would be needed, using the same etching chemistry, for the removal of a layer comprising the same material and/or the same thickness as the first or the second contact layer.

According to at least one embodiment of the method, after method step B) the following method steps are carried out:
C) whole-surface application of a first insulation layer onto exposed outer faces remote from the first semiconductor layer,
D) partial removal of the first insulation layer in the region of the second contact faces of the emission regions,
E) application of metallization to the regions of the second contact faces at which the first insulation layer has been removed.

The exposed outer faces may for example be the first contact face of the first contact layer, the second contact face of the second contact layer, the side faces of the emission regions and/or outer faces, remote from the emission regions, of the passivation layer.

The first insulation layer is formed with an electrically insulating material, such as for example $SiO_2$, SiN or $Al_2O_3$. The whole-surface application may proceed, in the present case, using a conformally covering deposition method. For example, application proceeds using a vapor deposition method or sputtering. "Whole-surface application" denotes here and hereinafter application such that the exposed outer faces are completely covered by the first insulation layer. After whole-surface application of the first insulation layer, the first semiconductor layer and the emission regions may be completely covered by the, in particular one-piece, first insulation layer.

Partial removal of the first insulation layer may proceed for example using a photo technique. In this case, the second contact layer may be exposed in the regions in which the first insulation layer has been partially removed.

After partial removal, the metallization is applied in the exposed regions. For application of the metallization, the same photo technique may be used as for the partial removal of the first insulation layer. The metallization is preferably in direct electrical contact with the second contact layer and serves in electrical contacting of the second contact layer. The second contact layer is preferably completely covered by the metallization and/or the first insulation layer and is no longer freely accessible from outside and is electrically contactable only via the metallization. In other words, the metallization encapsulates the openings in the first insulation layer produced during partial removal and may seal off the second contact layer with respect to the outside. The metallization may here project vertically beyond the first insulation layer. In other words, the metallization may be thicker than the first insulation layer.

The metallization in particular has an elevated thickness, of for example at least 0.2 µm. In particular, the metallization may have a thickness which corresponds to at least 5 times the thickness of the first and second contact layers.

According to at least one embodiment of the method, after step E) the following method steps are carried out: F) application of a second insulation layer which, together with the first insulation layer, forms a dielectric, such that the dielectric completely fills the recesses and projects vertically beyond the metallization, G) removal of the dielectric such that metal faces of the metallization remote from the first semiconductor layer terminate flush with end faces of the dielectric remote from the first semiconductor layer.

The second insulation layer is here preferably formed of the same material as the first insulation layer.

The dielectric may completely cover the first contact layer on the side thereof remote from the first semiconductor layer. The dielectric may furthermore completely cover the second contact layer, at locations which are free of the metallization. The dielectric preferably serves in additional electrical insulation of the first contact layer, the second contact layer and/or the metallization from one another and from the outside. In particular, a short circuit between the first contact layer and the second contact layer may be made more difficult by the dielectric.

Removal of the dielectric proceeds for example by means of a chemical mechanical polishing process. During said removal, regions of the metallization are for example also removed. After removal, the metal faces of the metallization terminate flush with the end faces of the dielectric. The metal faces thus preferably form a planar surface together with the end faces. In other words, the metal faces do not project beyond and/or less far than the end faces.

An optoelectronic semiconductor component is additionally provided. The optoelectronic semiconductor component may preferably be produced using a method described here.

All the features disclosed for the method are thus also disclosed for the optoelectronic semiconductor component and vice versa.

According to at least one embodiment of the optoelectronic semiconductor component, the latter comprises the patterned semiconductor layer sequence. The semiconductor layer sequence comprises the first semiconductor layer with the bottom face, the main plane of extension, the at least one recess, in particular the multiplicity of recesses, and the first top face remote from the bottom face in the region of the recesses. The semiconductor layer sequence further comprises the active layer and the second semiconductor layer at a side of the active layer remote from the first semiconductor layer.

The active layer and the second semiconductor layer are jointly patterned. The active layer and the second semiconductor layer are preferably jointly patterned into a multiplicity of regions spaced laterally from one another. Each region of the second semiconductor layer and of the active layer, together with the first semiconductor layer, forms one of the emission regions.

According to at least one embodiment of the optoelectronic semiconductor component, the latter comprises the first contact layer, which is applied to the first top face of the first semiconductor layer, and the second contact layer, which is applied to the second top face, remote from the bottom face, of the emission regions.

The first contact layer and the second contact layer are electrically separated from one another. In other words, the first contact layer and the second contact layer are not connected together electrically conductively. For example, the thickness of the first contact layer and of the second contact layer is less than the depth of the respectively associated recess. The depth of a recess for example comprises the patterned depth of the recess.

The first contact layer and the second contact layer extend within the bounds of manufacturing tolerances parallel to one another and to the main plane of extension. Furthermore, the first contact layer and the second contact layer have the same thickness. The first contact layer and the second contact layer are formed from the same material. Given the same thickness and formation from the same material, simultaneous production of the first contact layer and the second contact layer is discernible from the finished component.

According to at least one embodiment of the optoelectronic semiconductor component, the latter comprises a patterned semiconductor layer sequence comprising a one-piece first semiconductor layer with a bottom face, a main plane of extension, at least one recess, in particular a multiplicity of recesses, and a first top face remote from the bottom face in the region of the recesses. Furthermore, the optoelectronic semiconductor component comprises an active layer and a second semiconductor layer at a side of the active layer remote from the first semiconductor layer. The active layer and the second semiconductor layer are jointly patterned into regions, in particular into a multiplicity of laterally mutually spaced regions, and each region, together with the first semiconductor layer, forms an emission region. A first contact layer is applied to the first top face of the first semiconductor layer. A second contact layer is applied to the second top face, remote from the bottom face, of the emission regions.

The first contact layer and the second contact layer are not connected together electrically conductively, extend within the bounds of manufacturing tolerances parallel to one another and to the main plane of extension, have the same thickness and are formed from the same material. Furthermore, all of the side faces, extending transversely of the main plane of extension, of the at least one emission region and/or of the active layer are free of the first contact layer and of the second contact layer.

According to at least one embodiment of the optoelectronic semiconductor component, all of the side faces, extending transversely of the main plane of extension, of the emission regions are completely covered with the passivation layer. The passivation layer is an electrically insulating layer. The passivation layer may, for example, directly adjoin the side regions of the emission regions. For example, the passivation layer may directly adjoin the active layer, the first semiconductor layer and/or the second semiconductor layer.

According to at least one embodiment of the optoelectronic semiconductor component, the side faces of the emission regions or, if the passivation layer is applied to the side faces, outer faces of the passivation layer remote from the emission regions, exhibit traces of the material of the first contact layer and of the second contact layer. These traces of material may have been applied to the side faces of the emission regions or the outer faces of the passivation layer during directional deposition of the first contact layer and the second contact layer. The production method may thus be directly identified from the traces of the material.

According to at least one embodiment of the optoelectronic semiconductor component, the first contact layer is formed in one piece and encloses the emission regions in each case in the manner of a frame. "In the manner of a frame" does not here and hereinafter mean that the emission regions have to be enclosed at four side faces arranged at right angles to one another. Rather, in one plan view the emission regions may for example also be triangular, polygonal, oval or round and are enclosed accordingly by the first contact layer. In other words, in one plan view the first contact layer is of multiply connected configuration. In one plan view, the first contact layer would then appear to take the form of a grid or network, wherein the emission regions are enclosed by individual mesh loops of the grid or network. This connected configuration of the first contact layer in particular allows simple electrical contacting of the first semiconductor layer by means of a single first contact layer. The first contact layer may, for example, be extended outwards for electrical contacting at the edge of the optoelectronic semiconductor component or exposed at least in places at the edge of the optoelectronic semiconductor component.

According to at least one embodiment of the optoelectronic semiconductor component, the second contact layer is of multi-piece configuration, wherein a one-piece region of the second contact layer is associated on a one-to-one basis with each emission region. Preferably, each one-piece region of the second contact layer is of simply connected configuration in plan view.

According to at least one embodiment of the optoelectronic semiconductor component, the second contact layer is of one-piece and the first contact layer of multi-piece configuration, wherein one one-piece region of the first contact layer is associated on a one-to-one basis with each recess. The second contact layer encloses the first contact layer in the manner of a frame.

According to at least one embodiment of the optoelectronic semiconductor component, the first contact layer and the second contact layer appear as a continuous metal layer when viewed in plan view. In other words, there is always a plane which extends parallel to the main plane of extension through a metal layer.

According to at least one embodiment of the optoelectronic semiconductor component, the metallization with the metal faces remote from the emission regions is applied to the second contact layer. The metallization is of multi-piece configuration and one one-piece region of the metallization is associated on a one-to-one basis with each emission region. In this respect, each one-piece region of the metallization may have a smaller lateral extent than the emission region associated on a one-to-one basis therewith. In other words, in plan view the metallization is smaller than the emission regions.

According to at least one embodiment of the optoelectronic semiconductor component, the dielectric is arranged between the emission regions. The metal faces of the metallization here terminates flush with end faces of the dielectric remote from the first semiconductor layer.

The first contact layer is completely covered by the dielectric on the side thereof remote from the first semiconductor layer. The dielectric thus insulates the first contact layer electrically. Furthermore, the dielectric completely covers the second contact layer at points which are not covered by the metallization. The second contact layer is thus also electrically insulated by the dielectric.

According to at least one embodiment of the optoelectronic semiconductor component, the first top face of the first semiconductor layer is covered in places by the dielectric and/or by the passivation layer. For example, during the production process the passivation layer is initially applied to the side faces of the emission regions and then removed again. The first top face may then have been exposed in the regions in which the passivation layer was previously arranged. The dielectric is then applied at these points and adjoins the first top face.

The regions of the second contact layer project laterally in places beyond the respectively associated emission region. In other words, the second contact layer may have a greater lateral extent than the emission regions. From this lateral projection, removal of the previously present passivation layer may likewise be identified. Thus, on application of the first and second contact layers the upper outer face of the passivation layer remote from the first top face is also covered with the material of the second contact layer. On removal of the passivation layer, this additional material projects laterally beyond the emission regions.

According to at least one embodiment of the optoelectronic semiconductor component, the first top face of the first semiconductor layer is completely covered by the first contact layer. For example, no passivation layer has been used during the production process, whereby the first top face is exposed prior to application of the first contact layer. In this way, the first top face may be completely covered with the first contact layer.

BRIEF DESCRIPTION OF THE DRAWINGS

The method described here and the optoelectronic semiconductor component described here are explained in greater detail below with reference to exemplary embodiments and the associated figures.

FIGS. 1A to 1J show an exemplary embodiment of a method described here, by way of schematic sectional representations.

FIGS. 2 and 3 show exemplary embodiments of an optoelectronic semiconductor component described here, by way of schematic sectional representations.

DETAILED DESCRIPTION

Figure 1A:
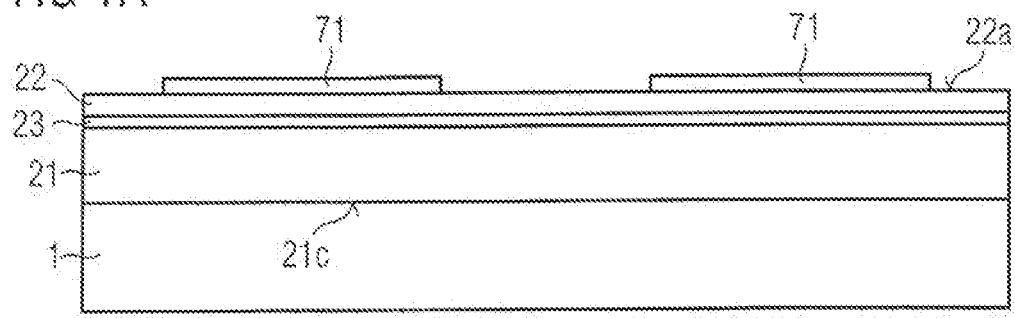

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

With reference to the schematic sectional representation of FIG. 1A, a first method step of a method described here for producing an optoelectronic semiconductor component is explained in greater detail. A semiconductor layer sequence 21, 22, 23 is provided on a growth substrate 1. The material of the semiconductor layer sequence 21, 22, 23 is based for example on a nitride compound semiconductor material. The semiconductor layer sequence 21, 22, 23 comprises a first semiconductor layer 21 with a bottom face 21c facing the growth substrate 1. An active layer 23 and a second semiconductor layer 22 are applied to the side of the first semiconductor layer 21 remote from the bottom face.

A patterned mask layer 71 is applied to an upper face 22a of the second semiconductor layer 22 remote from the bottom face 21c. The mask layer 71 may be patterned using a photo technique. For example, to this end the mask layer 71 may initially be applied over the entire surface of the second semiconductor layer 22 and then etched wet-chemically with BOE and/or dry-chemically with a fluorine or argon plasma using a patterned photoresist.

The mask layer 71 may for example be formed with SiN. Alternatively or in addition, the mask layer 71 may be formed with a transparent conductive oxide, such as for example indium-tin oxide. In this case, it is possible for the mask layer 71 not to be detached in the following method steps and to remain on the semiconductor component. The mask layer 71 may then be used as a protective contact.

Figure 1B:
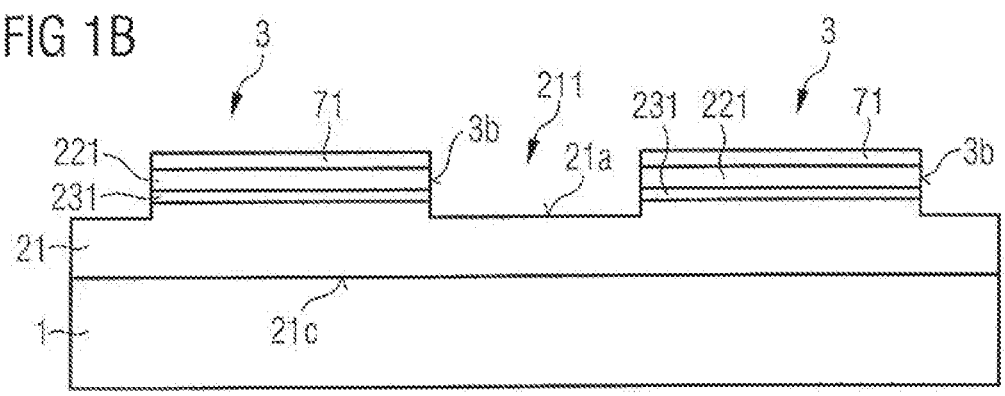

With reference to the schematic sectional representation of FIG. 1B, a further method step of a method described here is explained in greater detail. In this method step, the semiconductor layer sequence 21, 22, 23 is patterned. In this case, the second semiconductor layer 22 and the active layer 23 are completely removed in the regions which are not covered by the mask layer 71. Furthermore, the first semiconductor layer 21 is partially removed in these regions. The complete or partial removal is preferably performed using a dry chemical etching method. In this case, a chlorine and/or an argon plasma may for example be used.

After partial removal, a patterned semiconductor layer sequence 21, 22, 23 is present. The patterned semiconductor layer sequence 21, 22, 23 comprises the one-piece first semiconductor layer 21, which comprises recesses 211 in the regions which are not covered by the mask layer 71. In the region of the recesses 211, the first semiconductor layer 21 comprises a first top face 21a remote from the bottom face 21c.

In addition, the patterned semiconductor layer sequence 21, 22, 23 comprises the active layer 23 and the second semiconductor layer 22, which are jointly patterned into a multiplicity of laterally spaced regions 221, 231. Each of the regions 221, 231 forms, together with the first semiconductor layer 21, an emission region 3. The emission regions 3 are separated laterally from one another by the recesses 211. Furthermore, the emission regions 3 are connected together solely by the first semiconductor layer 21. Each emission region 3 comprises side faces 3b extending transversely of the main plane of extension of the first semiconductor layer 21. In addition, the emission regions 3 comprise a second top face 3a, which is of non-connected configuration. Prior to removal of the mask layer 71, a thin electrical conductive layer, which is formed for example with a conductive oxide, may optionally be deposited. Such a conductive layer serves in reducing the threshold voltage of the component.

In at least one exemplary embodiment, the patterning or partial removal proceeds in such a way that mutually facing side faces 3b of adjacent emission regions 3 are spaced apart from one another by at most 5 μm, preferably at most 2 μm. In other words, the recesses 211 have a width of at most 5 μm, preferably at most 2 μm.

Figure 1C:
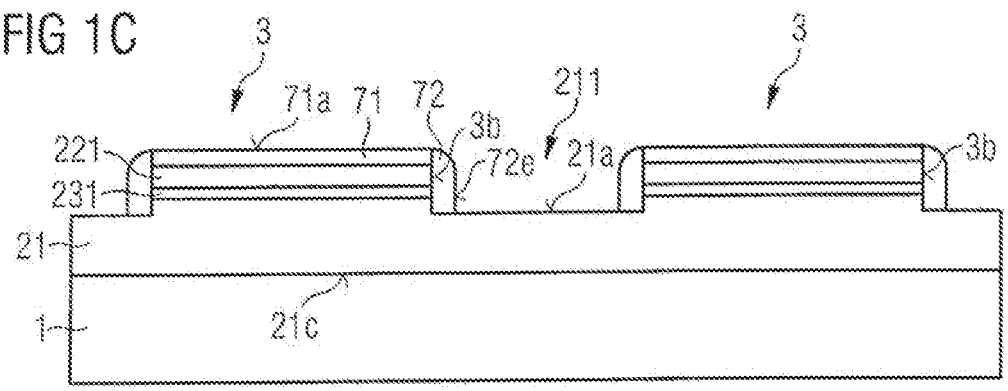

A further method step of a method described here is explained in greater detail with reference to the schematic sectional representation of FIG. 1C. In this method step a passivation layer 72 is applied to the side faces 3b, extending transversely of the main plane of extension, of the emission regions 3. The passivation layer 72 covers the side faces 3b of the emission regions 3 preferably completely and directly adjoins the regions of the active layer 231 and of the second semiconductor layer 221. The passivation layer 72 may thus serve in encapsulating the active layer 23 and thus in preventing short circuits. To this end, the passivation layer 72 is formed with an insulating material, such as for example $SiO_2$, SiN or $Al_2O_3$. Furthermore, the passivation layer 72 may adjoin the first top face 21a of the first semiconductor layer 21.

A further method step of a method described here is explained in greater detail with reference to the schematic sectional representation of FIG. 1D. In the method step shown, the mask layer 71 is removed. It is however also possible, unlike in the drawing, for the mask layer 71 to remain on the regions 221 of the second semiconductor layer 22. In this case, the mask layer 71 may for example be formed with a transparent conductive oxide and/or an electrically conductive material. Removal of the mask layer 71 may for example proceed with $H_3PO_4$ and/or a fluorine plasma. Removal of the mask layer 71 preferably proceeds using an etching chemistry which has high selectivity relative to the passivation layer 72. In other words, the passivation layer 72 is preferably not removed by the etching chemistry.

A further method step of a method described here for producing an optoelectronic semiconductor component is explained in greater detail with reference to the schematic sectional representation of FIG. 1E. In the method step shown, the first contact layer 41 and the second contact layer 42 are applied in a simultaneous method step. Application of the first contact layer 41 and the second contact layer 42 proceeds for example using a directional deposition method, such as for example evaporation. In this way, only faces which extend parallel to the main direction of extension of the first semiconductor layer 21 are covered with the first contact layer 41 and the second contact layer 42.

The first contact layer 41 is arranged after application on the first top face 21a of the first semiconductor layer 21. The first contact layer 41 is configured in one piece and multiply connected in plan view. The first contact layer 41 encloses the emission regions 3 in the manner of a frame.

Furthermore, after application the second contact layer 42 is arranged on the second top face 3a of the emission regions 3 and preferably covers these completely. In the present case, the second contact layer 42 is of multi-piece configuration, wherein one-piece regions 421 of the second contact layer 42 are each associated on a one-to-one basis with one emission region 3. Unlike what is shown in FIGS. 1A to 1J, the first contact layer 41 may alternatively also be of multi-piece configuration and the second contact layer 42 of one-piece configuration. In this case, one-piece regions of the first contact layer 41 are then each associated on a one-to-one basis with one recess 211.

The thickness of the first contact layer 41 and of the second contact layer 42 is selected to be less than the depth of the recesses 211. The thickness of the two contact layers 41, 42 may for example be adjusted by the duration of evaporation. This enables electrical separation of the first contact layer 41 and the second contact layer 42 through spatial separation.

It is possible for outer faces 72e of the passivation layer 72 to be covered with traces of the material 44 of the first contact layer 41 and the second contact layer 42 on application of the two contact layers 41, 42. These traces of the material 44 however have a distinctly smaller average thickness than the first contact layer 41 and the second contact layer 42.

A further method step of a method described here is explained in greater detail with reference to the schematic sectional representation of FIG. 1F. In the method step shown here, the traces of the material 44 are removed for example by means of brief immersion in a chemistry and/or by means of extended immersion in a highly dilute chemistry. It is alternatively also possible for the directional deposition method for the two contact layers 41, 42 not to leave behind any traces of the material 44 and thus for immersion in an etching bath to be unnecessary.

A further method step of a method described here is explained in greater detail with reference to the schematic sectional representation of FIG. 1G. In the method step shown here, an insulation layer 73 is applied over the entire surface of exposed outer faces remote from the first semiconductor layer 21. The exposed outer faces may in the present case be a first contact face 41a, remote from the first semiconductor layer 21, of the first contact layer 41 and second contact faces 42a, remote from the first semiconductor layer 21, of the second contact layer 42. In addition, outer faces 72e, remote from the emission regions 3, of the passivation layer 72 may also be covered by the insulation layer 73. Preferably, all the exposed outer faces are completely covered by the insulation layer 73. The insulation layer 73 may in the present case be a dielectric layer, which may for example be formed with $SiO_2$, SiN or $Al_2O_3$.

A further method step of a method described here for producing an optoelectronic semiconductor component is explained in greater detail with reference to the schematic sectional representation of FIG. 1H. In the method step shown, the first insulation layer 73 is partially removed in the region of the emission regions 3. In this case, the second contact faces 42a are exposed at least in places. The exposed regions 81 in which the second contacting face 42a is exposed preferably have a smaller lateral extent than the emission regions 3.

A further method step of a method described here is explained in greater detail with reference to the schematic sectional representation of FIG. 1I. Metallization 43 is applied to the second contact faces 42a at the exposed regions 81. The metallization 43 preferably completely fills up the exposed regions 81. The metallization 43 is of multi-piece configuration, wherein one-piece regions 431 of the metallization 43 are each associated on a one-to-one basis with one emission region 3.

A further method step of a method described here is explained in greater detail with reference to the schematic sectional representation of FIG. 1J. In the method step illustrated, a second insulation layer 74 is applied which, together with the first insulation layer 73, forms a dielectric 73, 74. The dielectric 73, 74 preferably completely fills up the recesses 211. The second insulation layer 74 is preferably applied in such a way that the dielectric 73, 74 completely fills up the recesses 211 and the end faces 74a, remote from the bottom face 21c, of the dielectric 74 terminate flush with the metal face 43a of the metallization 43. To this end, first of all the second insulation layer 74 is for example applied in such a way that it projects beyond the metallization 43 in the vertical direction at least in places and covers the metal face 43a at least in places. Using chemical mechanical polishing (CMP), the dielectric 73, 74 may be partially removed, such that the end face 74a and the metal face 43a terminate flush.

The assembly comprising the patterned semiconductor layer sequence 21, 22, 23, the passivation layer 72, the first contact layer 41, the second contact layer 42, the dielectric 73, 74 and the metallization 43 then forms a compact optoelectronic semiconductor component.

An optoelectronic semiconductor component described here is explained in greater detail with reference to the schematic sectional representation of FIG. 2. In comparison with the final method step of FIG. 1J, the growth substrate 1 is detached and an active matrix element 6 is arranged on the side of the optoelectronic semiconductor component remote from the bottom face 21c. This active matrix element 6 serves in electrical contacting of the regions of the second semiconductor layer 221 of the emission regions 3 using the metallizations 43. In particular, the regions 221 of the second semiconductor layer 22 may be individually driven. For example, to this end one control unit 61 in the active matrix element 6, which control unit may for example comprise at least one transistor, is associated with each emission region 3.

Furthermore, the first semiconductor layer 21 is partially removed at its bottom face 21c, such that the first contact layer 41 is partially freely accessible at these lateral openings 212. The first contact layer 41 may be electrically contacted at the lateral openings 212.

A further exemplary embodiment of an optoelectronic semiconductor component described here is explained in greater detail with reference to the schematic sectional representation of FIG. 3. The optoelectronic semiconductor component illustrated differs from that of FIG. 2 in that no passivation layer 72 is present in the regions of the recesses. This has been removed for example during the production process. The second contact layer 42 projects laterally beyond the emission regions 3. From these lateral projections it is possible to identify that a passivation layer 72 has been used during the production process, the passivation layer 72 having been removed.

Figure 4A:
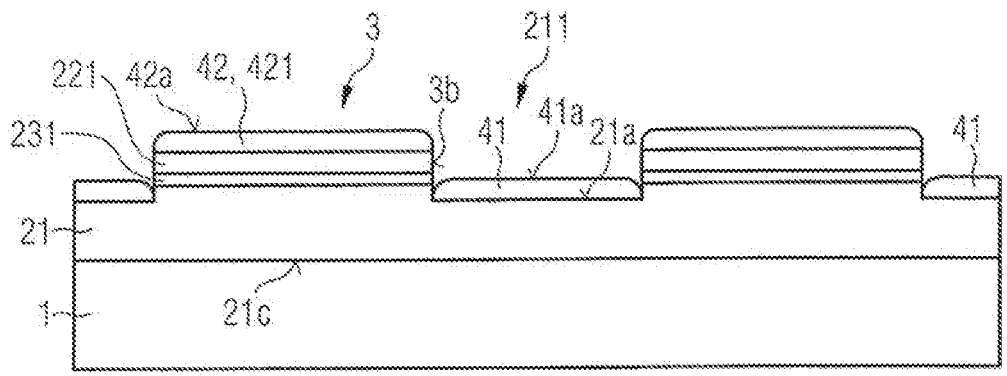
FIGS. 4A and 4B show an exemplary embodiment of a method described here, by way of schematic sectional representations.

An alternative method for producing an optoelectronic semiconductor component described here is explained in greater detail with reference to the schematic sectional representation of FIG. 4A. In the method step shown, the first contact layer 41 and the second contact layer 42 have already been applied. In contrast to the method of FIGS. 1A to 1J, no passivation layer 72 has been provided. This does away with the method step of applying the passivation layer 72, whereby the width of the recesses 211 may be reduced, since this is not limited by the finite extent of the passivation layer 72.

As a result of the lack of passivation layer 72, the first contact layer 41 directly adjoins the side faces 3b of the emission regions 3. In the exemplary embodiment shown, the first contact layer 41 completely covers the first top face 21a. The second contact layer 42 has a lateral extent which corresponds to the lateral extent of the emission regions 3. In other words, the second contact layer 42 does not project laterally beyond the emission regions 3 in the present exemplary embodiment.

Figure 4B:
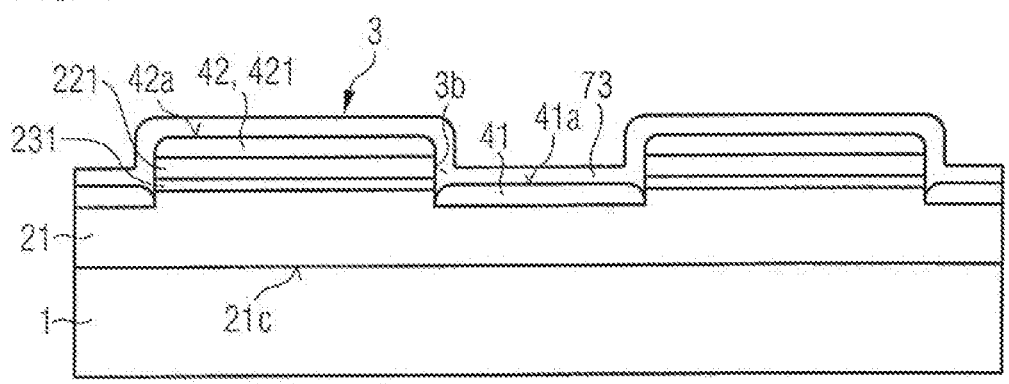

A further method step is explained in greater detail with reference to the schematic sectional representation of FIG. 4B. In the method step shown here, the first insulation layer 73 is applied. This directly adjoins the side faces 3b of the emission regions 3 and completely covers the first contact face 41a.

Figure 4C:
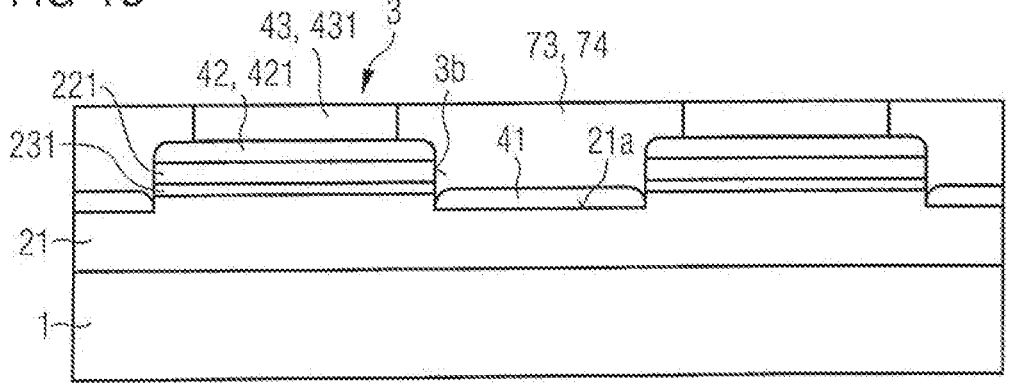
FIG. 4C shows an exemplary embodiment of an optoelectronic semiconductor component described here, by way of a schematic sectional representation.

An optoelectronic semiconductor component described here is explained in greater detail with reference to the schematic sectional representation of FIG. 4C. The optoelectronic semiconductor component produced using the method of FIGS. 4A and 4B is shown prior to separation of the growth substrate 1. The dielectric 73, 74 and the metallization 43 have been applied as in the method of FIGS. 1A to 1K. The dielectric 73, 74 directly adjoins the side faces 3b of the emission regions 3. The first top face 21a of the first semiconductor layer 21 is completely covered by the first contact layer 41.

Figure 5:
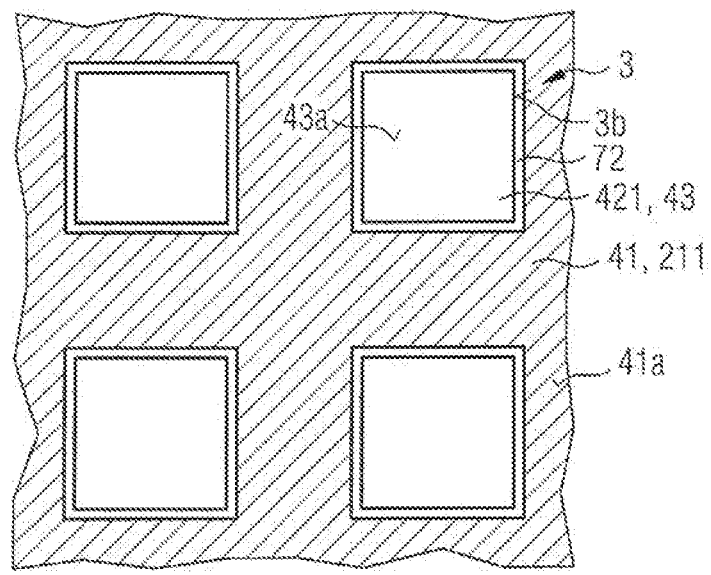
FIGS. 5 and 6 show exemplary embodiments of an optoelectronic semiconductor component described here, by way of schematic plan views.

An optoelectronic semiconductor component described here is explained in greater detail with reference to the schematic plan view of FIG. 5. Four emission regions 3 are shown, which are spaced laterally from one another. The emission regions 3 are separated by the recesses 211, which are covered with the first contact layer 41. The first contact layer 41 encloses the emission regions 3 in the manner of a frame. A passivation layer 72 is arranged at the side faces 3b of the emission regions 3. The emission regions 3 are covered by the second contact layer 42, which is subdivided into one-piece regions 421. The second contact layer is covered by the metallization 43, which comprises the metal faces 43a.

Figure 6:
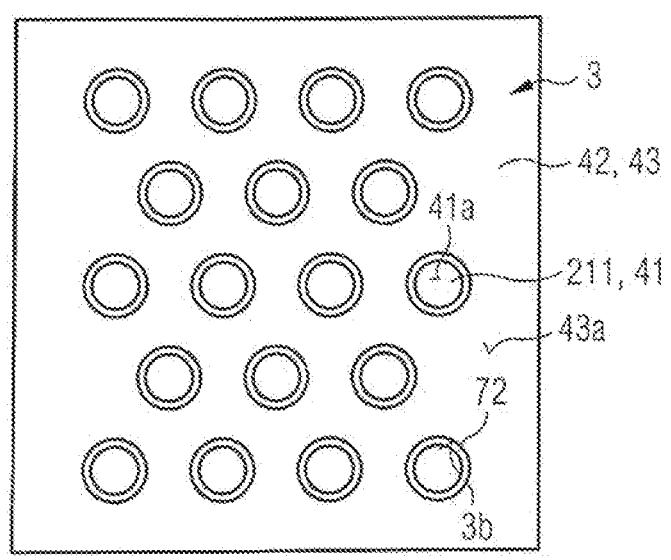

An optoelectronic semiconductor component described here is explained in greater detail with reference to the schematic plan view of FIG. 6. The optoelectronic semiconductor component of FIG. 6 comprises a single, one-piece emission region 3. The emission region 3 is patterned. Patterning proceeds by means of the multiplicity of recesses 211. The recesses 211 are covered with the first contact layer 41. The first contact layer 41 is of multi-piece configuration and encloses the recesses 211 in the manner of a frame. The side faces 3b of the emission region 3 are each covered by a passivation layer 72. The emission region 3 is covered by the second contact layer 42 and the metallization 43 with the metal face 43a.

The recesses 211 serve in the present case in simplified electrical contacting of the first semiconductor layer 21 covered by the second semiconductor layer 22. In particular, the first contact layer 41 introduced in the recesses 211 may for example be electrically contacted at the first contact face 41a. To this end, the first contact face 41a may be freely accessible and/or electrically contactable at least in places. The recesses 211 may in this case have the function of through-vias and/or leadthroughs.

In the case of the optoelectronic semiconductor component described here or of the method described here, the ideas are in particular pursued of providing, through simultaneous deposition of the first contact layer 41 and the second contact layer 42, an optoelectronic semiconductor component which is simple to produce and which has recesses 211 of small width between the emission regions 3. By making the recesses 211 between the emission regions 3 deep, it is in particular possible to effect electrical separation of the first contact layer 41 and the second contact layer 42 without additional insulation layers. In this way, the distances between the emission regions 3 may be particularly small.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

LIST OF REFERENCE NUMERALS

1 Growth substrate
21,22 First and second semiconductor layer respectively
23 Active layer
211 Recesses
212 Lateral opening
221 Regions of the second semiconductor layer
231 Regions of the active layer
21a First top face
21c Bottom face of the first semiconductor layer
3 Emission regions
3a Second top faces of the emission regions
3b Side faces of the emission regions
41,42 First and second contact layer respectively
41a,42a First and second contact face respectively
421 One-piece regions of the second contact layer
43 Metallization
431 One-piece regions of the metallization
6 Active matrix element
61 Control unit
71 Mask layer
72 Side passivation
72e Outer faces of the side passivation
73,74 First and second insulation layer respectively, dielectric
81 Opening of first insulation layer

The invention claimed is:

1. A method for producing an optoelectronic semiconductor component, comprising the following steps:
   A) provision of a patterned semiconductor layer sequence comprising
      a one-piece first semiconductor layer with a bottom face, a main plane of extension, at least one recess, in particular a multiplicity of recesses, and a first top face remote from the bottom face in the region of the recesses,
      an active layer and
      a second semiconductor layer at a side of the active layer remote from the first semiconductor layer, wherein
      the active layer and the second semiconductor layer are jointly patterned and, together with the first semiconductor layer, form at least one emission region; and
   B) simultaneous application of a first contact layer to the first top face and of a second contact layer to a second top face, remote from the first semiconductor layer, of the at least one emission region, wherein the first contact layer and the second contact layer are electrically separated from one another,
      wherein the first contact layer and the second contact layer extend within the bounds of manufacturing tolerances parallel to one another and to the main plane of extension, wherein prior to step B) a passivation layer is applied to side faces of the at least one emission region, and
      wherein the first contact layer and the second contact layer do not extend from the respective top faces to side faces of the active layer such that the active layer is free of the first contact layer and of the second contact layer.

2. The method according to claim 1, wherein the passivation layer is applied to all the side faces of the at least one emission region, the side faces extending transversely of the main plane of extension.

3. The method according to claim 1, wherein the passivation layer completely covers the side faces.

4. The method according to claim 1, wherein the passivation layer is removed after step B).

5. The method according to claim 1, wherein the first contact layer and the second contact layer are deposited by means of a directional deposition method.

6. The method according to claim 1, wherein, after step B), the as yet unfinished optoelectronic semiconductor component is immersed in an acid bath for a predeterminable interval of time, such that traces of the material of the first contact layer and of the second contact layer are removed from the side faces of the emission regions or outer faces, remote from the emission regions, of the passivation layer.

7. The method according to claim 1, wherein after step B) the following method steps are carried out:
   C) whole-surface application of a first insulation layer on exposed outer faces remote from the first semiconductor layer,
   D) partial removal of the first insulation layer in the region of second contact faces, remote from the emission regions, of the second contact layer; and
   E) application of metallization to the regions of the second contact faces at which the first insulation layer has been removed.

8. The method according to claim 7,
wherein after step E) the following method steps are carried out
F) application of a second insulation layer which, together with the first insulation layer, forms a dielectric, such that the dielectric completely fills the recesses and projects vertically beyond the metallization; and
G) removal of the dielectric such that metal faces of the metallization remote from the first semiconductor layer terminate flush with end faces of the dielectric remote from the first semiconductor layer.

9. The method according to claim 1, wherein all of the side faces, extending transversely of the main plane of extension, of the at least one emission region and/or of the active layer are not in direct contact with the first contact layer and the second contact layer.

10. An optoelectronic semiconductor component, comprising:
a patterned semiconductor layer sequence comprising
a one-piece first semiconductor layer with a bottom face, a main plane of extension, at least one recess, in particular a multiplicity of recesses, and a first top face remote from the bottom face in the region of the recesses,
an active layer and
a second semiconductor layer at a side of the active layer remote from the first semiconductor layer, wherein the active layer and the second semiconductor layer are jointly patterned into regions, in particular into a multiplicity of laterally mutually spaced regions, and each region, together with the first semiconductor layer, forms an emission region,
a first contact layer, which is applied to the first top face, and
a second contact layer, which is applied to a second top face, remote from the bottom face, of the emission regions, wherein the first contact layer and the second contact layer are not connected together electrically conductively, extend parallel to one another and to the main plane of extension within the bounds of manufacturing tolerances, have the same thickness and are formed from the same material, and
a passivation layer applied to side faces of the emission regions,
wherein the first contact layer and the second contact layer do not extend from the respective top faces to side faces of the active layer such that the active layer is free of the first contact layer and of the second contact layer.

11. The optoelectronic semiconductor component according to claim 10, wherein the passivation layer covers all the side faces of the emission regions, the side faces extending transversely of the main plane of extension.

12. The optoelectronic semiconductor component according to claim 10, wherein the passivation layer completely covers the side faces.

13. The optoelectronic semiconductor component according to claim 10, wherein the passivation layer directly adjoins regions of the active layer and of the second semiconductor layer.

14. The optoelectronic semiconductor component according to claim 10, wherein the first top face of the first semiconductor layer is covered in places by the passivation layer.

15. The optoelectronic semiconductor component according to claim 10, wherein the side faces of the emission regions or outer faces of the passivation layer remote from the emission regions exhibit traces of the material of the first contact layer and of the second contact layer.

16. The optoelectronic semiconductor component according to claim 10, wherein the first contact layer is of one-piece configuration and in each case encloses the emission regions in a manner of a frame, and
wherein the second contact layer is of multi-piece configuration, and a one-piece region of the second contact layer is associated on a one-to-one basis with each emission region.

17. The optoelectronic semiconductor component according to claim 10, wherein the first contact layer is of multi-piece configuration, and a one-piece region of the first contact layer is associated on a one-to-one basis with each recess, and wherein the second contact layer is of one-piece configuration, and encloses the recesses in the manner of a frame, wherein a one-piece region of the second contact layer is associated on a one-to-one basis with each emission region.

18. The optoelectronic semiconductor component according to claim 10, wherein the second contact layer projects laterally in places beyond the respectively associated emission region.

19. The optoelectronic semiconductor component according to claim 10, wherein all of the side faces, extending transversely of the main plane of extension, of the at least one emission region and/or of the active layer are not in direct contact with the first contact layer and the second contact layer.

20. A method for producing an optoelectronic semiconductor component, comprising the following steps:
A) provision of a patterned semiconductor layer sequence comprising
a one-piece first semiconductor layer with a bottom face, a main plane of extension, at least one recess, in particular a multiplicity of recesses, and a first top face remote from the bottom face in the region of the recesses,
an active layer and
a second semiconductor layer at a side of the active layer remote from the first semiconductor layer, wherein
the active layer and the second semiconductor layer are jointly patterned and, together with the first semiconductor layer, form at least one emission region; and
B) simultaneous application of a first contact layer to the first top face and of a second contact layer to a second top face, remote from the first semiconductor layer, of the at least one emission region, wherein the first contact layer and the second contact layer are electrically separated from one another,
wherein the first contact layer and the second contact layer extend within the bounds of manufacturing tolerances parallel to one another and to the main plane of extension, wherein prior to step B) a passivation layer is applied to side faces of the at least one emission region, and
wherein, after step B), the as yet unfinished optoelectronic semiconductor component is immersed in an acid bath for a predeterminable interval of time, such that traces of the material of the first contact layer and of the second contact layer are removed from the side faces of the emission regions or outer faces, remote from the emission regions, of the passivation layer.

* * * * *